United States Patent
Mitra et al.

(10) Patent No.: US 7,754,558 B1
(45) Date of Patent: Jul. 13, 2010

(54) METHOD OF AVOIDING UNWANTED METAL DEPOSITION ON A SEMICONDUCTOR RESISTOR STRUCTURE

(75) Inventors: Reshmi Mitra, South Portland, ME (US); Scott Ruby, Lisbon Falls, ME (US); Sergai Drizlikh, Scarborough, ME (US); Thomas Francis, South Portland, ME (US); Robert Tracy, South Portland, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 1084 days.

(21) Appl. No.: 11/195,937

(22) Filed: Aug. 3, 2005

(51) Int. Cl.
*H01L 21/8238* (2006.01)
*H01L 23/62* (2006.01)

(52) U.S. Cl. .................. 438/210; 438/329; 438/382; 438/751; 257/363; 257/380

(58) Field of Classification Search .................. None
See application file for complete search history.

(56) References Cited

U.S. PATENT DOCUMENTS 6,315,384 B1 * 11/2001 Ramaswami et al. .......... 347/20
2003/0020069 A1 * 1/2003 Holmes et al. ................ 257/76

FOREIGN PATENT DOCUMENTS

JP          2000323665 A    * 11/2000

OTHER PUBLICATIONS

Hans P. Tuinhout et al., "Design and Characterization of a High-Precision Resistor Ladder Test Structure", IEEE Transactions on Semiconductor Manufacturing, vol. 16, No. 2, May 2003, pp. 187-193.

M. Z. Lee et al., "Characteristics of Vertical Thermal/PECVD Polysilicon Oxides Formed on the Sidewall of Polysilicon Films", Journal of the Electrochemical Society, 150 (1) pp. G28-G32 (2003).

Shylaja Katakam et al., "Resistor Matching Characterization for Process Development Using D/A Converter", Proc. IEEE 2001 Int. Conference on Microelectronics Test Structures, vol. 14, Mar. 2001, pp. 219-222.

Abu H. M. Kamel et al., Obtaining Silicide Free Spacers by Optimizing Sputter Etch for Deep Submicron CMOS Processes, IEEE Transactions on Semiconductor Manufacturing, vol. 15, No. 3, Aug. 2002, pp. 350-354.

S.Y. Ku et al., "Pre-Metal Clean Optimization for Cluster Defect Prevention", 2001 IEEE, pp. 499-501.

Stefan Hausser et al., "Mismatch in Diffusion Resistors Caused by Photolithography", IEEE Transactions on Semiconductor Manufacturing, vol. 16, No. 2, May 2003, pp. 181-186.

* cited by examiner

Primary Examiner—Alonzo Chambliss

(57) ABSTRACT

An electrical resistance is produced in a semiconductor device by first providing a semiconductor resistor structure that includes a semiconductor resistor having formed thereon a native oxide layer. A portion of the native oxide layer that overlies a corresponding top surface portion of the semiconductor resistor is removed, in order to expose the top surface portion of the semiconductor resistor. Metal is deposited on the exposed top surface portion of the semiconductor resistor. A chemical reaction is effectuated in order to reduce the likelihood of metal reacting with the underlying silicon on any portion of the semiconductor resistor other than the top surface portion thereof. The chemical reaction can be an oxidation reaction that produces on the semiconductor resistor structure an oxide layer other than the native oxide layer and substantially thicker than the native oxide layer.

22 Claims, 1 Drawing Sheet

METHOD OF AVOIDING UNWANTED METAL DEPOSITION ON A SEMICONDUCTOR RESISTOR STRUCTURE

TECHNICAL FIELD OF THE INVENTION

The invention is directed generally to semiconductor devices and, more particularly, to manufacturing resistors in semiconductor devices.

BACKGROUND OF THE INVENTION

Resistors are commonly used in semiconductor devices such as integrated circuits. For example, semiconductor devices such as digital-to-analog converters or analog-to-digital converters use semiconductor resistors such as polysilicon resistors. The precision and resolution of a device such as a digital-to-analog converter is strongly dependent on the ability to match its component semiconductor resistors accurately. Mismatches as small as two percent (2%) can seriously compromise the resolution and precision of such devices.

It is therefore desirable to provide for improved precision and consistency in the manufacture of semiconductor resistances.

SUMMARY OF THE INVENTION

Exemplary embodiments of the invention produce an electrical resistance in a semiconductor device by first providing a semiconductor resistor structure that includes a semiconductor resistor having formed thereon a native oxide layer. A portion of the native oxide layer that overlies a corresponding top surface portion of the semiconductor resistor is removed, in order to expose the top surface portion of the semiconductor resistor. Metal is deposited using blank deposition process on the entire wafer surface including the exposed top surface portion of the semiconductor resistor. A chemical reaction in combination with the etch process is effectuated in order to reduce the likelihood of metal reacting with the underlying silicon surface on any portion of the semiconductor resistor other than the aforementioned top surface portion thereof. In some embodiments, the chemical reaction is an oxidation reaction that produces on the semiconductor resistor structure an oxide layer other than the native oxide layer and substantially thicker than the native oxide layer.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged semiconductor manufacturing system.

Figure 1:
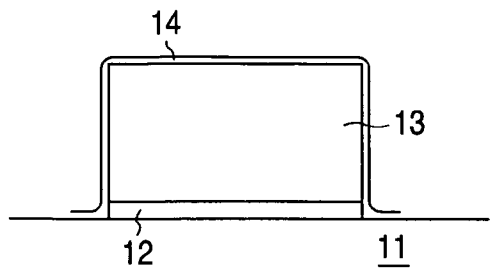
FIG. 1 illustrates a native oxide formed on a semiconductor resistor according to the prior art.

FIG. 1 illustrates a semiconductor resistor structure just before pre-metal cleaning according to the prior art. The structure includes a semiconductor resistor 13, such as a doped polysilicon resistor. The resistor 13 is supported on a semiconductor substrate 11, with a suitable oxide layer 12 interposed between the resistor 13 and the substrate 11. A native is oxide layer 14 is formed on the semiconductor resistor 13. The native oxide layer 14 typically has a thickness in a range from about 10 angstroms to about 30 angstroms.

Figure 2:
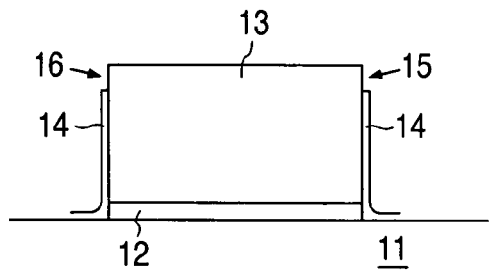
FIG. 2 illustrates the structure of FIG. 1 after cleaning and etching according to the prior art.

FIG. 2 illustrates the structure of FIG. 1 after being subjected to cleaning and etching steps according to the prior art. In particular, a structure such as shown in FIG. 1 is typically subjected to a wet cleaning process (e.g., dilute HF, followed by DI (deionized) rinse), and thereafter to a pre-sputter etching operation. The cleaning operation, the etching operation, or a combination of both operations results in removal of the native oxide 14 from the top surface of the semiconductor resistor 13, and also typically results in removal of portions of the native oxide 14 at locations on the respective sidewalls of the semiconductor resistor 13. Examples of sidewall locations where oxide is removed are shown at 15 and 16 in FIG. 2. Metal can thus be deposited on the exposed portions of the sidewalls during a subsequent metal deposition operation (e.g., cobalt sputtering).

The present invention recognizes that absence of the native oxide layer 14 on one or both sidewalls of the semiconductor resistor 13, and the associated metal deposition on the exposed sidewall portion(s), and a subsequent annealing process causes salicidation. This salicidation results in an undesired alteration of the resistance of the semiconductor resistor 13. The amount of native oxide removed from the sidewalls can vary from one resistor to another due to marginalities in the process, which leads to undesirable and unpredictable resistor mismatch situations.

Figure 3:
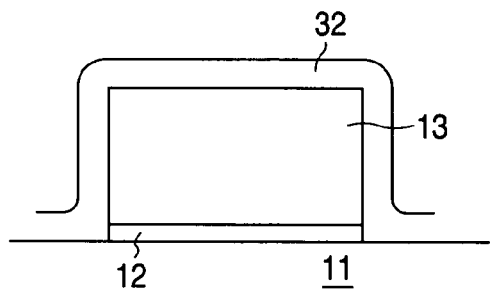
FIG. 3 is similar to FIG. 1 but includes a thickened oxide layer produced according to exemplary embodiments of the invention.
Figure 4:
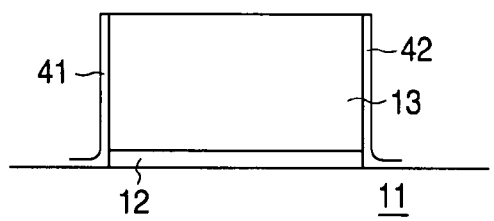
FIG. 4 illustrates the structure of FIG. 3 after etching according to exemplary embodiments of the invention.

FIG. 3 is generally similar to FIG. 1, but includes a thickened oxide layer 32 according to exemplary embodiments of the invention. In some embodiments, the oxide layer 32 has a thickness in a range from about 60 angstroms to about 100 angstroms. More generally, in some embodiments, the oxide layer 32 has a thickness in a range from about twice the thickness of the native oxide layer (see FIG. 1) to about ten times the thickness of the native oxide layer 14. In various embodiments, the oxide layer 32 bears various relative thickness relationships with respect to the native oxide layer 14.

The oxide layer 32 can be produced by effectuating a chemical oxidation operation after the cleaning operation is performed on the structure in FIG. 1, and before the etching operation. Thus in some embodiments, the oxide layer 32 actually incorporates portions of the native oxide layer 14 of FIG. 1 that remain after the cleaning operation. In some embodiments, the chemical oxidation operation includes, after the cleaning operation, exposing the semiconductor resistor structure to an oxidizing agent. This is achieved in some embodiments by exposing the semiconductor resistor structure to a suitable SC2 (standard clean2) environment. As is well known in the art, an SC2 environment includes HCl, $H_2O_2$ and DI water. The $H_2O_2$ acts as the oxidizing agent. In addition the combination of $H_2O_2$ and DI water can be used.

The thickened oxide 32 of FIG. 3 reduces the likelihood that the etching operation will expose any part of the sidewalls of the semiconductor resistor 13. Thus, the etching operation can be expected to result in the structure illustrated in FIG. 4, wherein the oxide 32 has been removed from the top surface of the semiconductor resistor 13, but the sidewalls of the semiconductor resistor 13 remain covered by remaining portions 41 and 42 of the thickened oxide 32. The structure of FIG. 4 can then be subjected to metal deposition (e.g., sputtering) with little risk of any salicidation of the sidewalls of the semiconductor resistor 13.

The remaining oxide layer portions 41 and 42 have various thicknesses in various embodiments. Either or both may have a thickness that is greater than, less than, or about the same as the thickness of the original native oxide layer 14 of FIG. 1.

The etching operation is designed to be highly anisotropic (highly directionally oriented), which further increases the likelihood that the sidewalls of the semiconductor resistor 13 remain covered by the oxide portions 41 and 42 after the etching operation has been completed. In some embodiments, the anisotropic etch uses the following exemplary parameters: a negative DC bias of about 195 volts; a coil power of about 300 watts; and an RF bias of about 100 watts.

Figure 5:
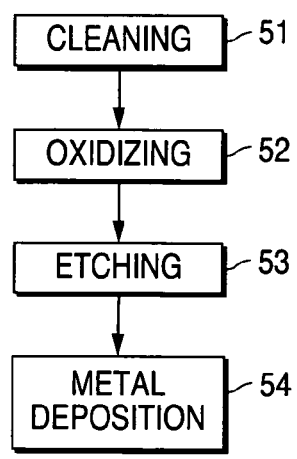
FIG. 5 illustrates exemplary semiconductor processing operations which can be performed according to exemplary embodiments of the invention.

FIG. 5 illustrates exemplary operations which can be performed during the manufacturing of semiconductor resistors according to exemplary embodiments of the invention. Beginning with a structure similar to that illustrated generally in FIG. 1, a cleaning operation can be performed at 51, for example the type of wet cleaning operation described above with respect to FIGS. 1 and 2. Thereafter, at 52, an oxidizing operation is performed in order to produce a structure such as shown, for example, in FIG. 3. Thereafter, an etching operation is performed at 53 in order to produce a structure such as illustrated, for example, in FIG. 4. After the etching operation, a metal deposition operation (e.g., sputtering) is performed at 54, with a reduced likelihood of saliciding the sidewalls of the semiconductor resistor structure 13, due to remaining sidewall oxide portions such as illustrated, for example, at 41 and 42 in FIG. 4.

Figure 6:
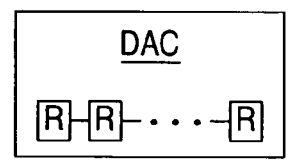
FIG. 6 diagrammatically illustrates a digital-to-analog converter (DAC) according to an exemplary embodiment of the invention.

FIG. 6 diagrammatically illustrates a digital-to-analog converter (DAC) according to an exemplary embodiment of the invention. The DAC of FIG. 6 is a semiconductor device including a plurality of semiconductor resistors R that have been produced according to exemplary operations such as described above with respect to FIG. 5, and which are coupled to one another according to the design of the DAC to form an analog circuit portion of the DAC. An analog-to-digital converter (ADC) (not shown) may also be formed with a plurality of semiconductor resistors R that have been produced according to exemplary operations such as described above with respect to FIG. 5.

Although the present invention has been described with exemplary embodiments, various changes and modifications may be suggested to one skilled in the art. It is intended that the present invention encompass such changes and modifications as fall within the scope of the appended claims.

The invention claimed is:

1. A method of producing at least one electrical resistance in a semiconductor device, comprising:
   providing a semiconductor resistor structure including a semiconductor resistor having formed thereon a native oxide layer;
   removing a portion of the native oxide layer to expose a top surface portion of the semiconductor resistor;
   forming, on the top surface portion of the semiconductor resistor, a second oxide layer that is thicker than the native oxide layer;
   etching the second oxide layer to expose the top surface portion of the semiconductor resistor without exposing sidewalls of the semiconductor resistor; and
   depositing metal on the exposed top surface portion of the semiconductor resistor.

2. The method of claim 1, wherein the second oxide layer is at least about twice as thick as the native oxide layer.

3. The method of claim 1, wherein the second oxide layer has a thickness in a range from about twice as thick as the native oxide layer to about ten times as thick as the native oxide layer.

4. The method of claim 1, wherein the second oxide layer has a thickness in a range from about 60 angstroms to about 100 angstroms.

5. The method of claim 1, wherein removing the portion of the native oxide layer includes performing a cleaning operation.

6. The method of claim 5, wherein the second oxide layer is formed after the cleaning operation and before etching the second oxide layer.

7. The method of claim 1, wherein etching the second oxide layer includes anisotropic etching.

8. The method of claim 1, wherein forming the second oxide layer includes effectuating a chemical oxidation operation.

9. A semiconductor device including an electrical resistance that is produced according to the method that is set forth in claim 1.

10. The method of claim 1, wherein:
    a plurality of electrical resistances are formed; and
    the method further comprises coupling the electrical resistances to one another to produce an analog circuit portion of the semiconductor device.

11. A method of producing a semiconductor device, comprising:
    producing a plurality of electrical resistances, wherein producing the electrical resistances includes, for each of the electrical resistances:
       providing a semiconductor resistor structure including a semiconductor resistor having formed thereon a native oxide layer;
       removing a portion of the native oxide layer to expose a top surface portion of the semiconductor resistor;

depositing metal on the exposed top surface portion of the semiconductor resistor; and after providing the semiconductor resistor structure and before depositing the metal, producing on the semiconductor resistor a second oxide layer other than the native oxide layer, the second oxide layer thicker than the native oxide layer; and coupling the resistances to one another to produce an analog circuit portion of the semiconductor device.

12. The method of claim 11, wherein the semiconductor device converts between digital signals and analog signals.

13. The method of claim 11, wherein removing the portion of the native oxide layer includes performing at least one of a cleaning operation and an etching operation.

14. The method of claim 11, wherein removing the portion of the native oxide layer includes performing both a cleaning operation and an etching operation, and wherein producing the second oxide layer is performed after the cleaning operation and before the etching operation.

15. The method of claim 14, wherein the etching operation includes anisotropic etching.

16. The method of claim 11, wherein producing the second oxide layer includes effectuating a chemical oxidation operation.

17. A method of producing at least one electrical resistance in a semiconductor device, comprising:

providing a semiconductor resistor structure including a semiconductor resistor having formed thereon a native oxide layer;

removing a portion of the native oxide layer that overlies a corresponding top surface portion of the semiconductor resistor to expose the top surface portion of the semiconductor resistor;

effectuating a chemical reaction on the semiconductor resistor to form a second oxide layer on the top surface portion of the semiconductor resistor, the second oxide layer thicker than the native oxide layer;

etching the second oxide layer to expose the top surface portion of the semiconductor resistor without exposing sidewalls of the semiconductor resistor; and depositing metal on the exposed top surface portion of the semiconductor resistor.

18. The method of claim 17, wherein removing the portion of the native oxide layer includes performing a cleaning operation.

19. The method of claim 17, wherein effectuating the chemical reaction occurs after the cleaning operation and before etching the second oxide layer.

20. The method of claim 17, wherein effectuating the chemical reaction includes effectuating a chemical oxidation operation.

21. A semiconductor device including an electrical resistance that is produced according to the method that is set forth in claim 17.

22. The method of claim 17, wherein:

a plurality of electrical resistances are formed; and the method further comprises coupling the electrical resistances to one another to produce an analog circuit portion of the semiconductor device.

* * * * *

UNITED STATES PATENT AND TRADEMARK OFFICE
CERTIFICATE OF CORRECTION

| | |
|---|---|
| PATENT NO. | : 7,754,558 B1 |
| APPLICATION NO. | : 11/195937 |
| DATED | : July 13, 2010 |
| INVENTOR(S) | : Reshmi Mitra et al. |

It is certified that error appears in the above-identified patent and that said Letters Patent is hereby corrected as shown below:

Column 3, line 7, insert --14-- after the term "layer".

Signed and Sealed this
Seventeenth Day of May, 2011

David J. Kappos
*Director of the United States Patent and Trademark Office*